(12) United States Patent
Che et al.

(10) Patent No.: US 11,069,715 B2
(45) Date of Patent: Jul. 20, 2021

(54) MEMORY STRUCTURE

(71) Applicant: Powerchip Semiconductor Manufacturing Corporation, Hsinchu (TW)

(72) Inventors: Shyng-Yeuan Che, Hsinchu County (TW); Shih-Ping Lee, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 13 days.

(21) Appl. No.: 16/285,245

(22) Filed: Feb. 26, 2019

(65) Prior Publication Data

US 2020/0227444 A1 Jul. 16, 2020

(30) Foreign Application Priority Data

Jan. 15, 2019 (TW) ................................ 108101445

(51) Int. Cl.
| | |
|---|---|
| *H01L 27/12* | (2006.01) |
| *H01L 29/06* | (2006.01) |
| *H01L 21/308* | (2006.01) |
| *H01L 49/02* | (2006.01) |
| *H01L 21/768* | (2006.01) |
| *H01L 29/78* | (2006.01) |

(52) U.S. Cl.
CPC ...... *H01L 27/1207* (2013.01); *H01L 21/3086* (2013.01); *H01L 21/76831* (2013.01); *H01L 28/60* (2013.01); *H01L 29/0642* (2013.01); *H01L 29/78* (2013.01)

(58) Field of Classification Search
CPC . H01L 29/7812; H01L 29/7824; H01L 29/78; H01L 27/1203–1211; H01L 27/76264–76291; G11C 2211/4016
See application file for complete search history.

(56) References Cited

U.S. PATENT DOCUMENTS

| | | |
|---|---|---|
| 6,949,785 B2 | 9/2005 | Tu |
| 7,408,216 B2 | 8/2008 | Forbes et al. |
| 7,682,896 B2 | 3/2010 | Ho et al. |

(Continued)

OTHER PUBLICATIONS

"Office Action of Taiwan Counterpart Application", dated Jun. 29, 2020, p. 1-p. 4.

*Primary Examiner* — Walter H Swanson
(74) *Attorney, Agent, or Firm* — JCIPRNET

(57) ABSTRACT

A memory structure including a SOI substrate, a first transistor, a second transistor, an isolation structure and a capacitor is provided. The SOI substrate includes a silicon base, a dielectric layer and a silicon layer. The first transistor and the second transistor are disposed on the silicon layer. The isolation structure is disposed in the silicon layer between the first transistor and the second transistor. The capacitor is disposed between the first transistor and the second transistor. The capacitor includes a body portion, a first extension portion, a second extension portion and a third extension portion. The first extension portion extends from the body portion to a source/drain region of the first transistor. The second extension portion extends from the body portion to a source/drain region of the second transistor. The third extension portion extends from the body portion, penetrates through the isolation structure and extends into the dielectric layer.

14 Claims, 11 Drawing Sheets

(56) References Cited

U.S. PATENT DOCUMENTS

| | | | |
|---|---|---|---|
| 8,653,596 B2 | 2/2014 | Cheng et al. | |
| 8,890,227 B1 | 11/2014 | Chen et al. | |
| 2002/0063291 A1* | 5/2002 | Brown | H01L 29/94 |
| | | | 257/359 |
| 2009/0305470 A1* | 12/2009 | Anderson | H01L 29/66181 |
| | | | 438/154 |
| 2010/0283093 A1* | 11/2010 | Pei | H01L 27/1203 |
| | | | 257/303 |
| 2011/0042731 A1* | 2/2011 | Ho | H01L 21/84 |
| | | | 257/296 |

* cited by examiner

MEMORY STRUCTURE

CROSS-REFERENCE TO RELATED APPLICATION

This application claims the priority benefit of Taiwan application serial no. 108101445, filed on Jan. 15, 2019. The entirety of the above-mentioned patent application is hereby incorporated by reference herein and made a part of this specification.

BACKGROUND

Technical Field

The present invention is related to a semiconductor structure, and more particularly to a memory structure.

Description of Related Art

A memory structure including a transistor and a capacitor has been developed. In such memory structure, the capacitor is used as a storage device. Under the current trend of increasing the level of integration of devices, how to effectively improve the electrical performance of the memory device without increasing the memory cell size has been the current goal of the industry.

SUMMARY

The present invention provides a memory structure in which a portion of a capacitor is disposed in an isolation structure and a silicon layer of a silicon-on-insulator substrate.

The present invention provides a memory structure that includes a silicon-on-insulator (SOI) substrate, a first transistor, a second transistor, an isolation structure and a capacitor. The silicon-on-insulator substrate includes a silicon base, and a first dielectric layer and a silicon layer sequentially disposed on the silicon base. The first transistor and the second transistor are disposed on the silicon layer. The isolation structure is disposed in the silicon layer between the first transistor and the second transistor. The capacitor is disposed between the first transistor and the second transistor, and includes a body portion, a first extension portion, a second extension portion and a third extension portion. The first extension portion extends from the body portion to a source/drain region of the first transistor. The second extension portion extends from the body portion to a source/drain region of the second transistor. The third extension portion extends from the body portion, penetrates through the isolation structure, and extends into the first dielectric layer.

According to an embodiment of the present invention, a width of the third extension portion is substantially constant.

The present invention provides a memory structure that includes a silicon-on-insulator (SOI) substrate, a first transistor, a second transistor, an isolation structure, a capacitor and a liner layer. The silicon-on-insulator substrate includes a silicon base, and a first dielectric layer and a silicon layer sequentially disposed on the silicon base. The first transistor and the second transistor are disposed on the silicon layer. The isolation structure is disposed in the silicon layer between the first transistor and the second transistor. The capacitor is disposed between the first transistor and the second transistor, and includes a body portion, a first extension portion, a second extension portion and a third extension portion. The first extension portion extends from the body portion to a source/drain region of the first transistor. The second extension portion extends from the body portion to a source/drain region of the second transistor. The third extension portion extends from the body portion, penetrates through the isolation structure, and extends into the first dielectric layer. The third extension portion includes a first part and a second part, the second part is located in the first dielectric layer, and a projection area of the second part on the silicon base is greater than a projection area of the first part on the silicon base. The liner layer is disposed between the first extension portion and the third extension portion, between the second extension portion and the third extension portion, between the isolation structure and the third extension portion, and between the first dielectric layer and the third extension portion.

According to an embodiment of the present invention, the first part is partially located in the first dielectric layer.

According to an embodiment of the present invention, the first transistor is one of an N-type metal oxide semiconductor transistor and a P-type metal oxide semiconductor transistor, and the second transistor is the other of the N-type metal oxide semiconductor transistor and the P-type metal oxide semiconductor transistor.

According to an embodiment of the present invention, the memory structure further includes a second dielectric layer disposed on the silicon layer and covering the first transistor and the second transistor, wherein the body portion, the first extension portion, the second extension portion and a portion of the third extension portion are located in the second dielectric layer.

According to an embodiment of the present invention, a thickness of the isolation structure is the same as a thickness of the silicon layer.

According to an embodiment of the present invention, the capacitor is composed of a lower electrode, an upper electrode, and an insulating layer between the lower electrode and the upper electrode, and each of the body portion, the first extension portion, the second extension, and the third extension portion includes a part of the lower electrode, a part of the upper electrode and a part of the insulating layer.

According to an embodiment of the present invention, the lower electrode in the first extension portion is connected to the source/drain region of the first transistor.

According to an embodiment of the present invention, the lower electrode in the second extension portion is connected to the source/drain region of the second transistor.

Based on the above, in the memory structure of the present invention, a capacitor penetrates through an isolation structure and extends downwardly to the dielectric layer of a silicon-on-insulator substrate, so that the coupling ratio between the lower electrode and the upper electrode and therefore the performance of the memory structure can be improved without increasing the layout area and the thickness of the memory structure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
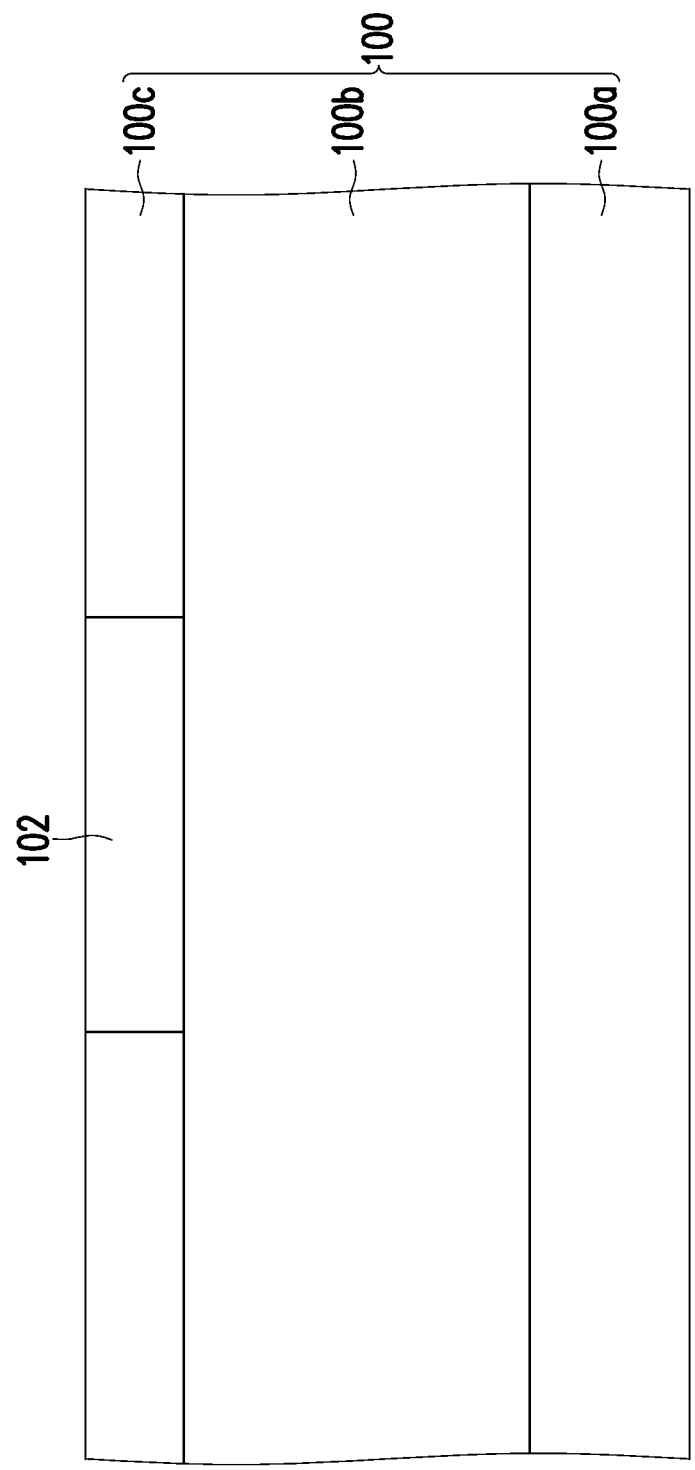
FIG. 1A to FIG. 1F are schematic cross-sectional views showing a manufacturing process of a memory structure according to a first embodiment of the present invention.

The embodiments are described in detail below with reference to the accompanying drawings, but the embodiments are not intended to limit the scope of the invention. In addition, the drawings are for illustrative purposes only and are not drawn to the original dimensions. For the sake of easy understanding, the same elements in the following description will be denoted by the same reference numerals.

In addition, the terms mentioned in the text, such as "comprising", "including" and "having" are all open-ended terms, i.e., meaning "including but not limited to". In addition, the directional terms mentioned in the text, such as "upper" and "lower", are merely used to refer to the drawings and are not intended to limit the invention.

FIG. 1A to FIG. 1F are schematic cross-sectional views showing a manufacturing process of a memory structure according to a first embodiment of the present invention.

Referring to FIG. 1A, a silicon-on-insulator substrate 100 is provided. The silicon-on-insulator substrate 100 includes a silicon base 100a, and a dielectric layer 100b and a silicon layer 100c sequentially disposed on the silicon base 100a. In general, the silicon base 100a may be doped, for example, with a P-type dopant and preferably has a thickness of about 5,000 Å, the dielectric layer 100b preferably has a thickness greater than about 2 µm, and the silicon layer 100c may be doped with, for example, P-type dopant and preferably has a thickness greater than about 0.5 µm. The dielectric layer 100b is, for example, a silicon oxide layer. Next, an isolation structure 102 is formed in the silicon layer 100c to define active areas (AA). The isolation structure is, for example, a shallow trench isolation (STI) structure. The thickness of the isolation structure 102 is the same as the thickness of the silicon layer 100c; that is, the isolation structure 102 penetrates through the silicon layer 100c, so that the adjacent active regions can be effectively isolated. The formation method of the isolation structure 102 is well-known to those skilled in the art and is not described herein.

Figure 1B:
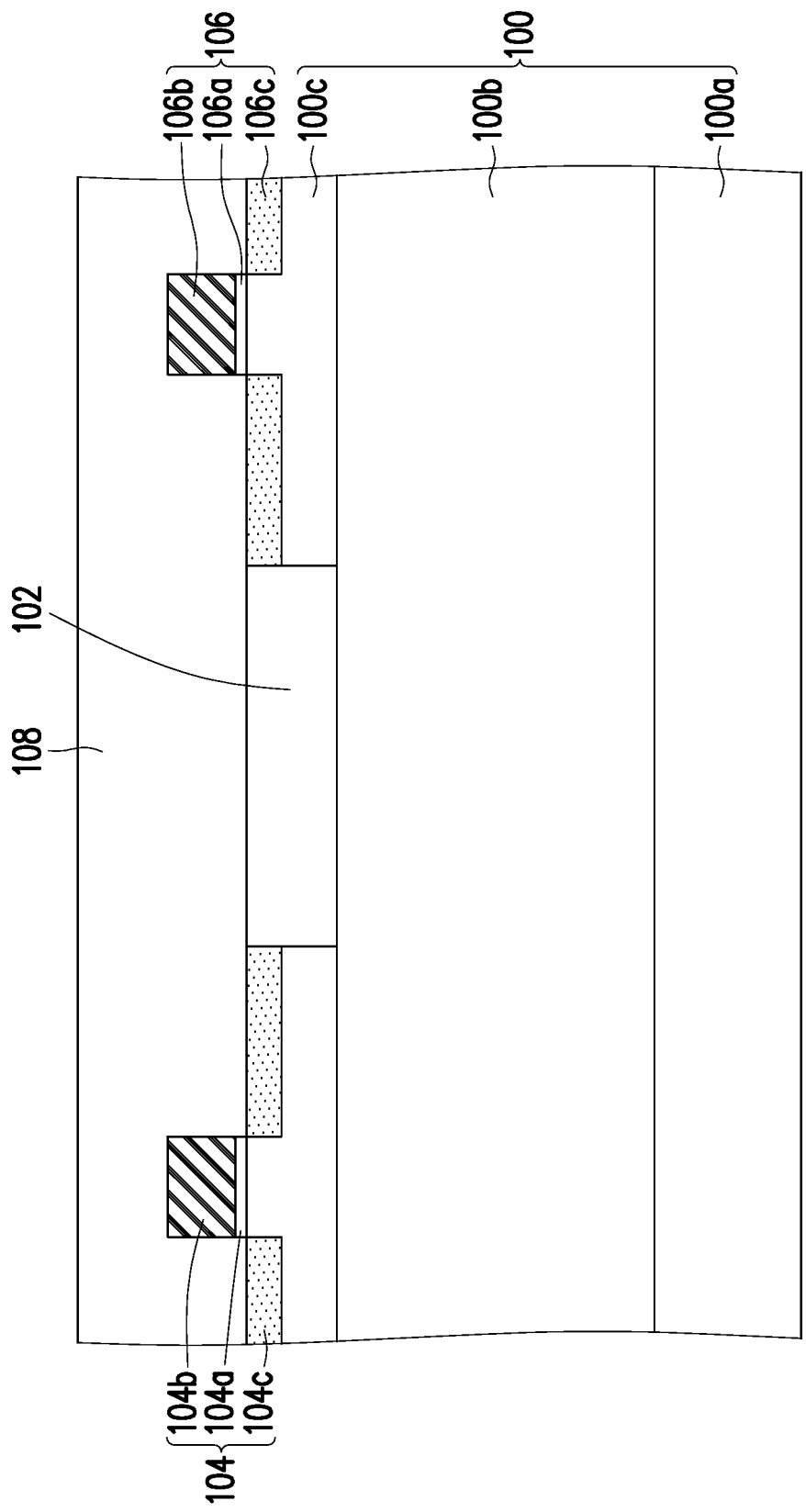

Referring to FIG. 1B, a transistor 104 and a transistor 106 are formed on the silicon layer 100c. The transistor 104 and the transistor 106 are separated from each other by the isolation structure 102. The transistor 104 has a conductivity type different from that of the transistor 106. For example, the transistor 104 is an N-type metal oxide semiconductor transistor, and the transistor 106 is a P-type metal oxide semiconductor transistor. On the contrary, the transistor 104 is a P-type metal oxide semiconductor transistor, and the transistor 106 is an N-type metal oxide semiconductor transistor. In the present embodiment, the transistor 104 includes a gate dielectric layer 104a and a gate 104b sequentially disposed on the silicon layer 100c, and a doped region 104c as a source/drain disposed in the silicon layer 100c. Similarly, the transistor 106 includes a gate dielectric layer 106a and a gate 106b sequentially disposed on the silicon layer 100c, and a doped region 106c as a source/drain disposed in the silicon layer 100c. The forming methods of the transistor 104 and the transistor 106 are well-known to those skilled in the art and are not be described herein. Thereafter, a dielectric layer 108 is formed on the silicon layer 100c. The dielectric layer 108 covers the transistor 104 and the transistor 106. The dielectric layer 108 is, for example, an silicon oxide layer. The dielectric layer 108 is generally referred to as an inter-layer dielectric layer.

Figure 1C:
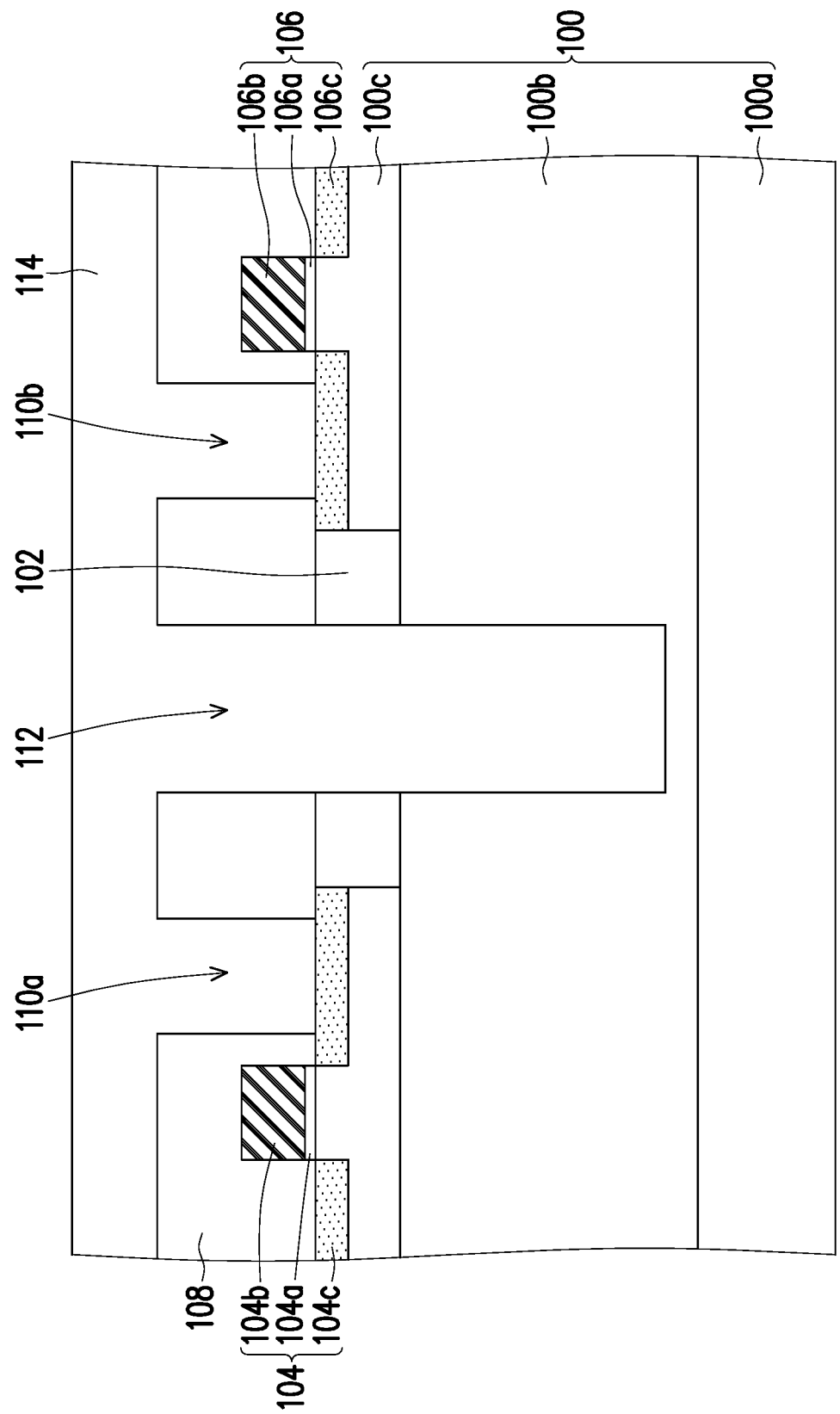

Referring to FIG. 1C, a trench 110a and a trench 110b are formed in the dielectric layer 108, and a trench 112 is formed in the dielectric layer 108, the isolation structure 102, and the dielectric layer 100b. The trench 110a exposes a portion of the source/drain region 104c of the transistor 104. The trench 110b exposes a portion of the source/drain region 106c of the transistor 106. The bottom of the trench 112 is located in the dielectric layer 100b without exposing the silicon base 100a. The trench 110a, the trench 110b and the trench 112 are formed by, for example, performing a first lithography and etching process to form the trench 110a and the trench 110b, and then performing a second lithography and etching process to form the trench 112. Alternatively, the trench 112 may be formed first, and the trench 110a and the trench 110b are then formed. Alternatively, depending on the process conditions, the trench 110a, the trench 110b, and the trench 112 may be simultaneously formed in a single patterning process. Thereafter, a sacrificial layer 114 is formed on the dielectric layer 108. The sacrificial layer 114 completely fills the trench 110a, the trench 110b, and the trench 112. The sacrificial layer 114 may have an etch rate the same as or similar to that of the dielectric layer 108 during the subsequent etching process. In the present embodiment, the sacrificial layer 114 is, for example, a common organic planarizing layer (OPL).

Figure 1D:
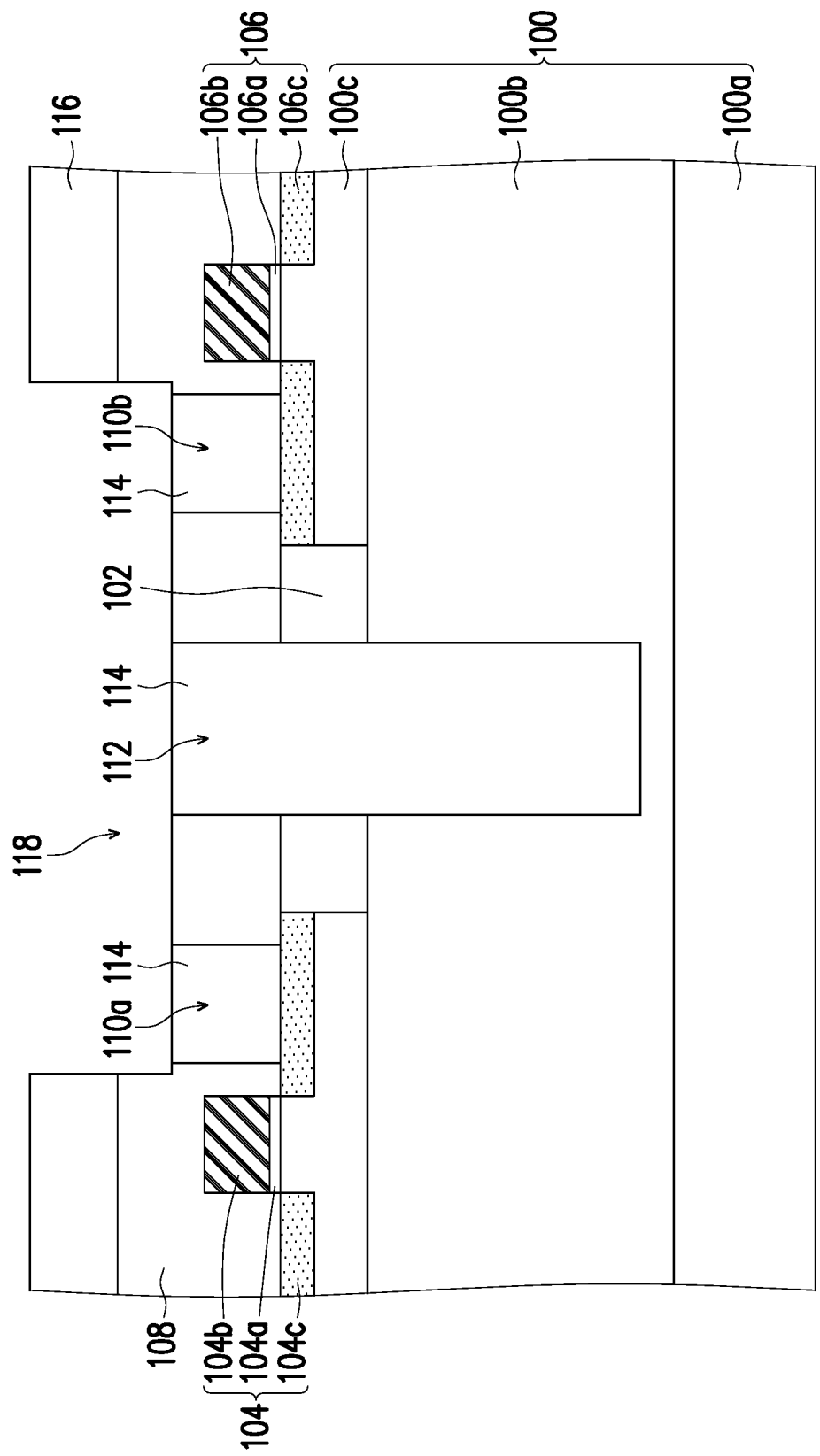

Referring to FIG. 1D, a planarization process is performed to remove a portion of the sacrificial layer 114 until the dielectric layer 108 is exposed. The above planarization process is, for example, a chemical mechanical polishing (CMP) process. Then, a patterned mask layer 116 is formed on the dielectric layer 108. The patterned mask layer 116 exposes the area between the gate 104b and the gate 106b. Thereafter, an anisotropic etching process is performed by using the patterned mask layer 116 as an etch mask, so as to remove a portion of the dielectric layer 108 and a portion of the sacrificial layer 114 and therefore form a trench 118. In another embodiment, the patterned mask layer 116 may be directly formed on the sacrificial layer 114 without performing the planarization process described above.

Figure 1E:
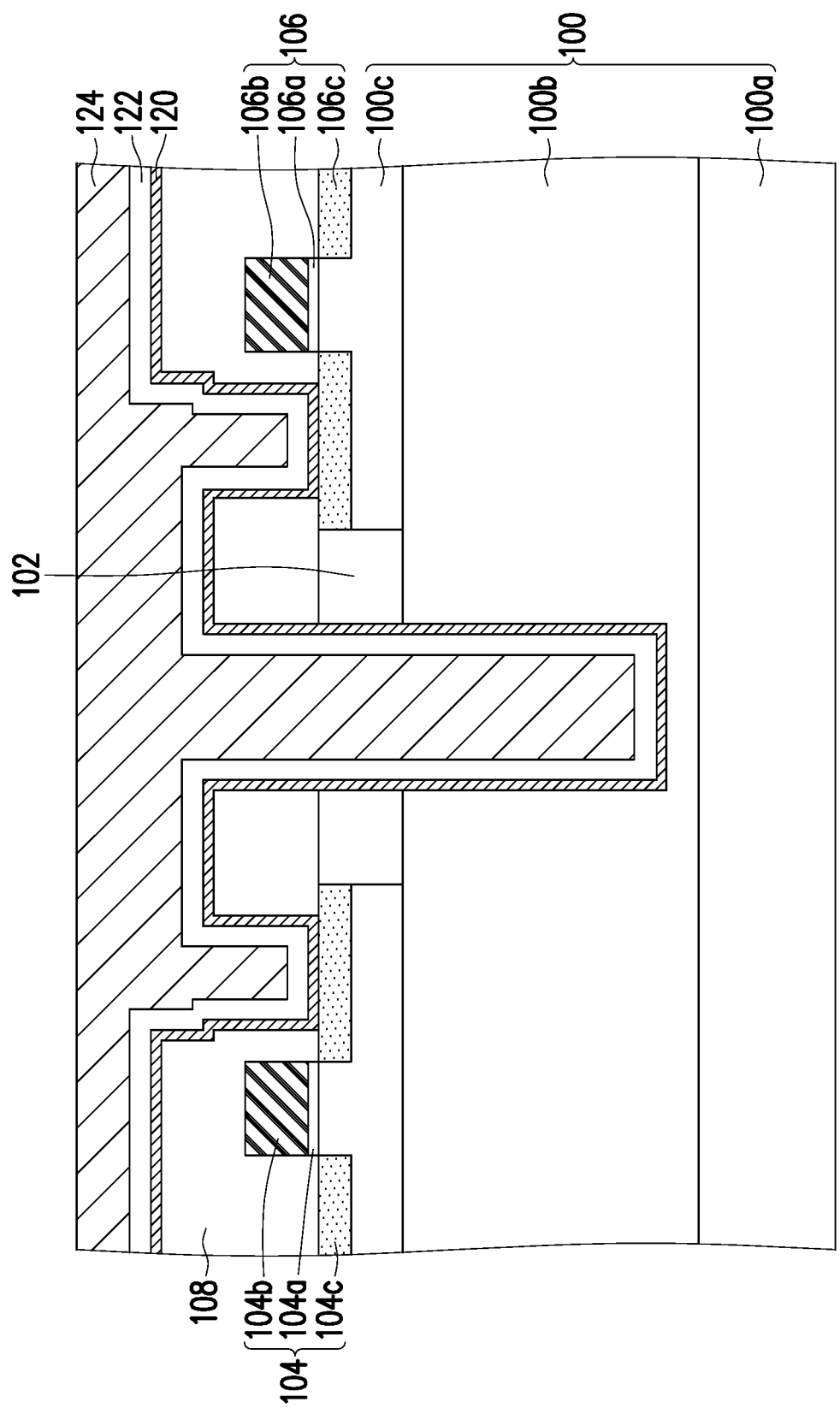

Referring to FIG. 1E, the patterned mask layer 116 and the sacrificial layer 114 are removed. Next, a conductive layer 120 for forming a lower electrode of the capacitor is conformally formed on the silicon-on-insulator substrate 100. The conductive layer 120 is, for example, a titanium nitride layer. Next, a dielectric layer 122 for forming an insulating layer of the capacitor is conformally formed on the conductive layer 120. The dielectric layer 122 is, for example, a high dielectric constant (high-k) layer. Thereafter, a conductive layer 124 for forming an upper electrode of the capacitor is formed on the dielectric layer 122. The conductive layer 124 completely fills the trench 110a, the trench 110b, and the trench 112. The conductive layer 124 is, for example, a composite layer composed of a tungsten layer and a titanium nitride layer.

Figure 1F:
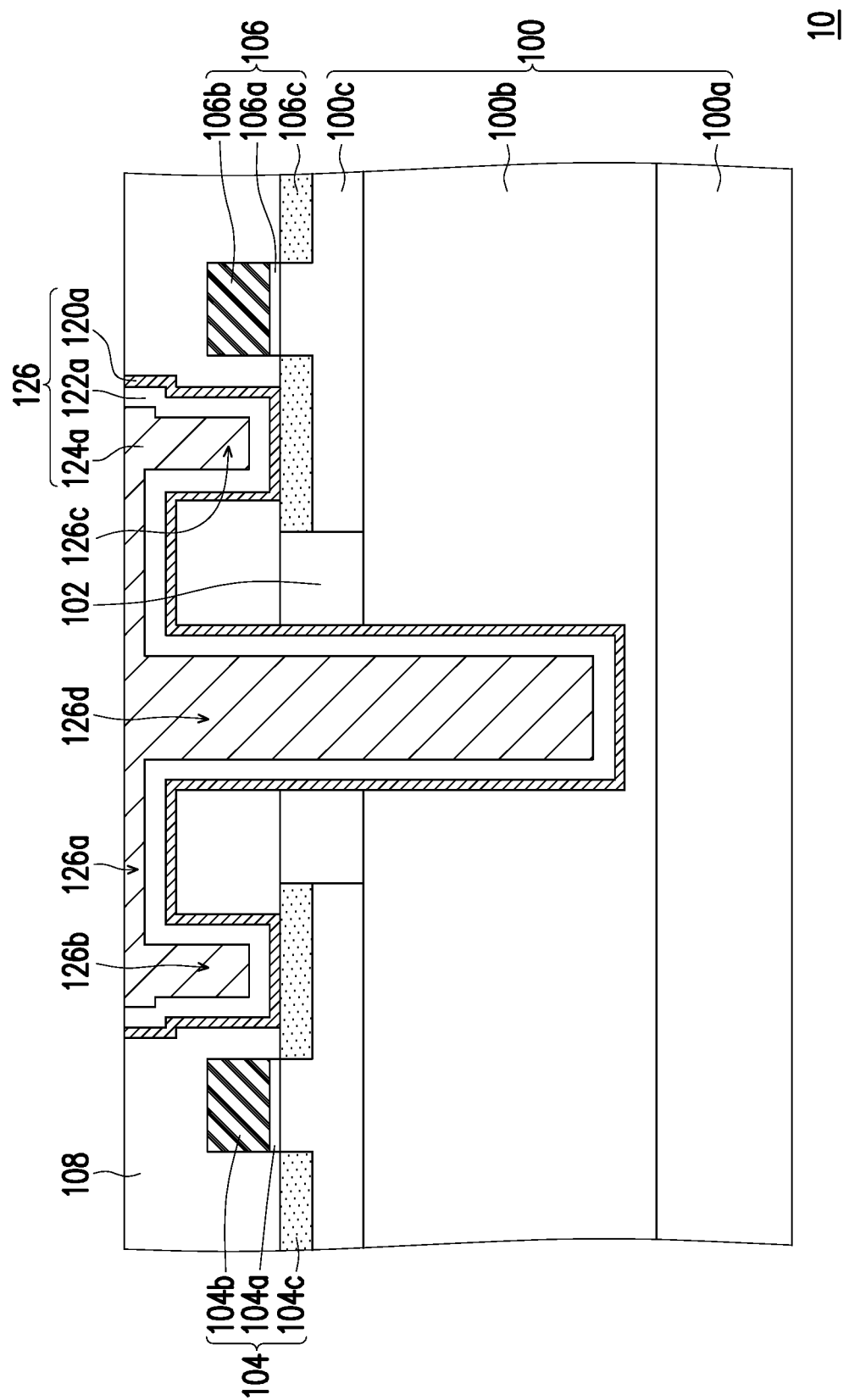

Referring to FIG. 1F, a planarization process is performed to remove a portion of the conductive layer 120, a portion of the dielectric layer 122, and a portion of the conductive layer 124 until the dielectric layer 108 is exposed. The above planarization process is, for example, a chemical mechanical polishing process. After the planarization process, a capacitor 126 is formed to include a lower electrode 120a, an insulating layer 122a, and an upper electrode 124a. That is, the capacitor 126 belongs to the well-known metal-insulator-metal (MIM) capacitor. Accordingly, the memory structure 10 of the present embodiment is completed. In addition, a contact connected to the transistor 104, a contact connected to the transistor 106, a contact connected to the upper electrode 124a of the capacitor 126, and the like may be subsequently formed, and these elements are well-known to those skilled in the art and are not be described herein.

In the present embodiment, the memory structure 10 includes a silicon-on-insulator substrate 100, an isolation structure 102, a transistor 104, a transistor 106 and a capacitor 126. The capacitor 126 is disposed between the transistor 104 and the transistor 106. The capacitor 126 is composed of a lower electrode 120a, an insulating layer 122a and an upper electrode 124a, and the insulating layer 122a is located between the lower electrode 120a and the upper electrode 124a. Further, the capacitor 126 includes a body portion 126a, an extension portion 126b, an extension portion 126c and an extension portion 126d. Besides, each of the body portion 126a, the extension portion 126b, the extension portion 126c, and the extension portion 126d includes a part of the lower electrode 120a, a part of the insulating layer 122a and a part of the upper electrode 124a. As shown in FIG. 1F, the body portion 126a is substantially horizontally located between the gate 104b and the gate 106b. The extension portion 126b extends from the body portion 126a to the source/drain region (e.g., doped region 104c) of the transistor 104 and is electrically connected to the source/drain region of the transistor 104 via the lower electrode 120a. The extension portion 126c extends from the body portion 126a to the source/drain region (e.g., doped region 106c) of the transistor 106, and is electrically connected to the source/drain region of the transistor 106 via the lower electrode 120a. The extension portion 126d extends from the body portion 126a, penetrates through the isolation structure 102 and further extends into the dielectric layer 100b. Accordingly, the capacitor 126 can be electrically connected to both the transistor 104 and the transistor 106. Further, in the present embodiment, the extension portion 126d has a substantially constant width.

In the memory structure 10, the extension portion 126d of the capacitor 126 penetrates down through the isolation structure 102 and extends into the dielectric layer 100b, so that the coupling ratio between the lower electrode 120a and the upper electrode 124a and therefore the performance of the memory structure can be increased without increasing the layout area and the thickness of the memory structure.

FIG. 2A to FIG. 2E are schematic cross-sectional views showing a manufacturing process of a memory structure according to a second embodiment of the present invention. The same elements as those of the first embodiment are denoted by the same reference numerals and are not be described again.

Figure 2A:
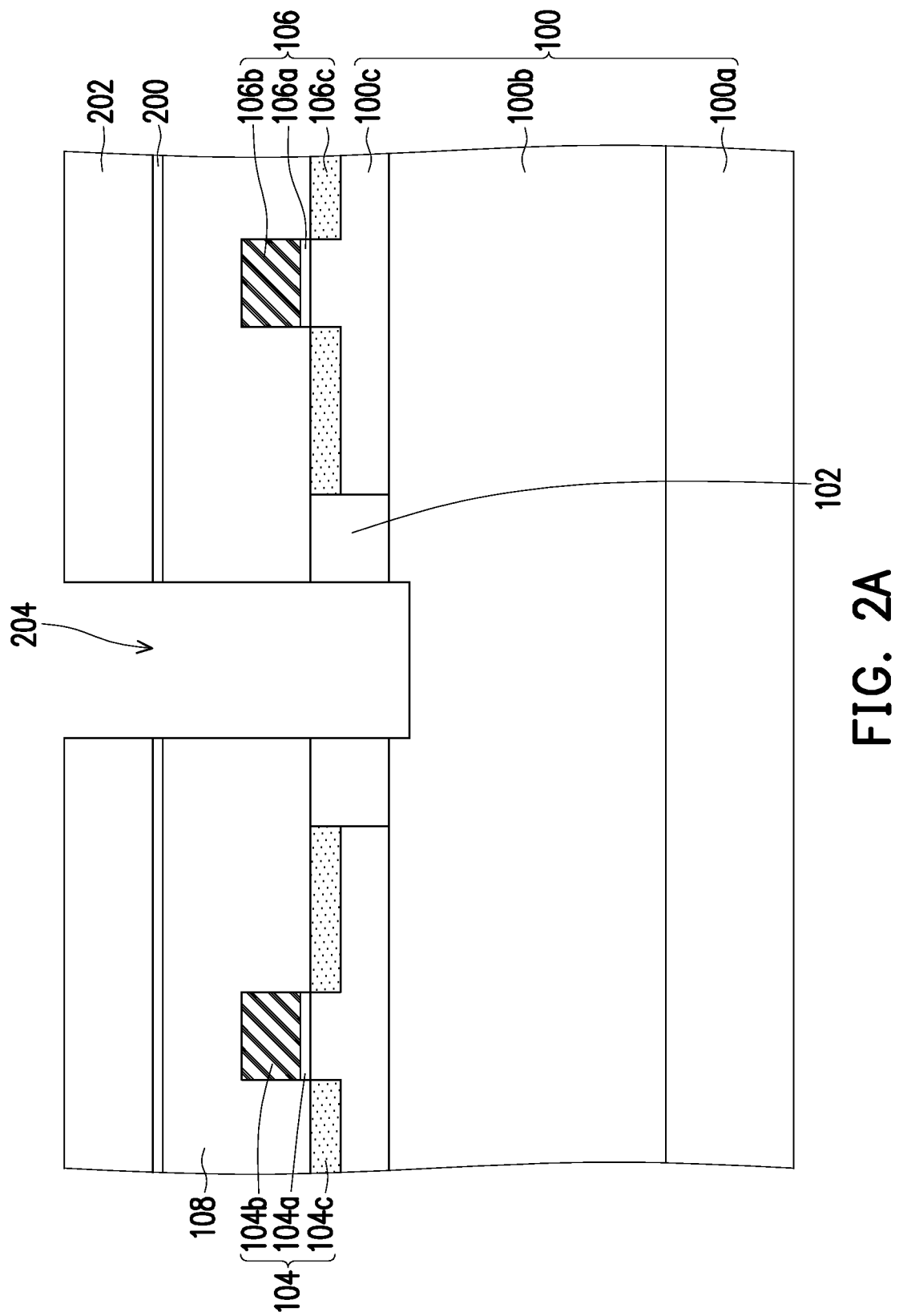
FIG. 2A to FIG. 2E are schematic cross-sectional views showing a manufacturing process of a memory structure according to a second embodiment of the present invention.

Referring to FIG. 2A, after forming the structure shown in FIG. 1B, an etch stop layer 200 is formed on the dielectric layer 108. The etch stop layer 200 is, for example, a silicon nitride layer. Next, a patterned mask layer 202 is formed on the etch stop layer 200. The patterned mask layer 202 exposes a portion of the area above the isolation structure 102. Then, an anisotropic etching process is performed by using the patterned mask layer 202 as an etch mask, so as to remove a portion of the etch stop layer 200, a portion of the isolation structure 102 and a portion of the dielectric layer 100b and therefore form a trench 204. In the present embodiment, the bottom of the trench 204 is located in the dielectric layer 100b, but the invention is not limited thereto. In other embodiments, the above-described anisotropic etching process may only remove a portion of the etch stop layer 200 and a portion of the isolation structure 102 without removing the dielectric layer 100b, so that the bottom surface of the formed trench is coplanar with the top surface of the dielectric layer.

Figure 2B:
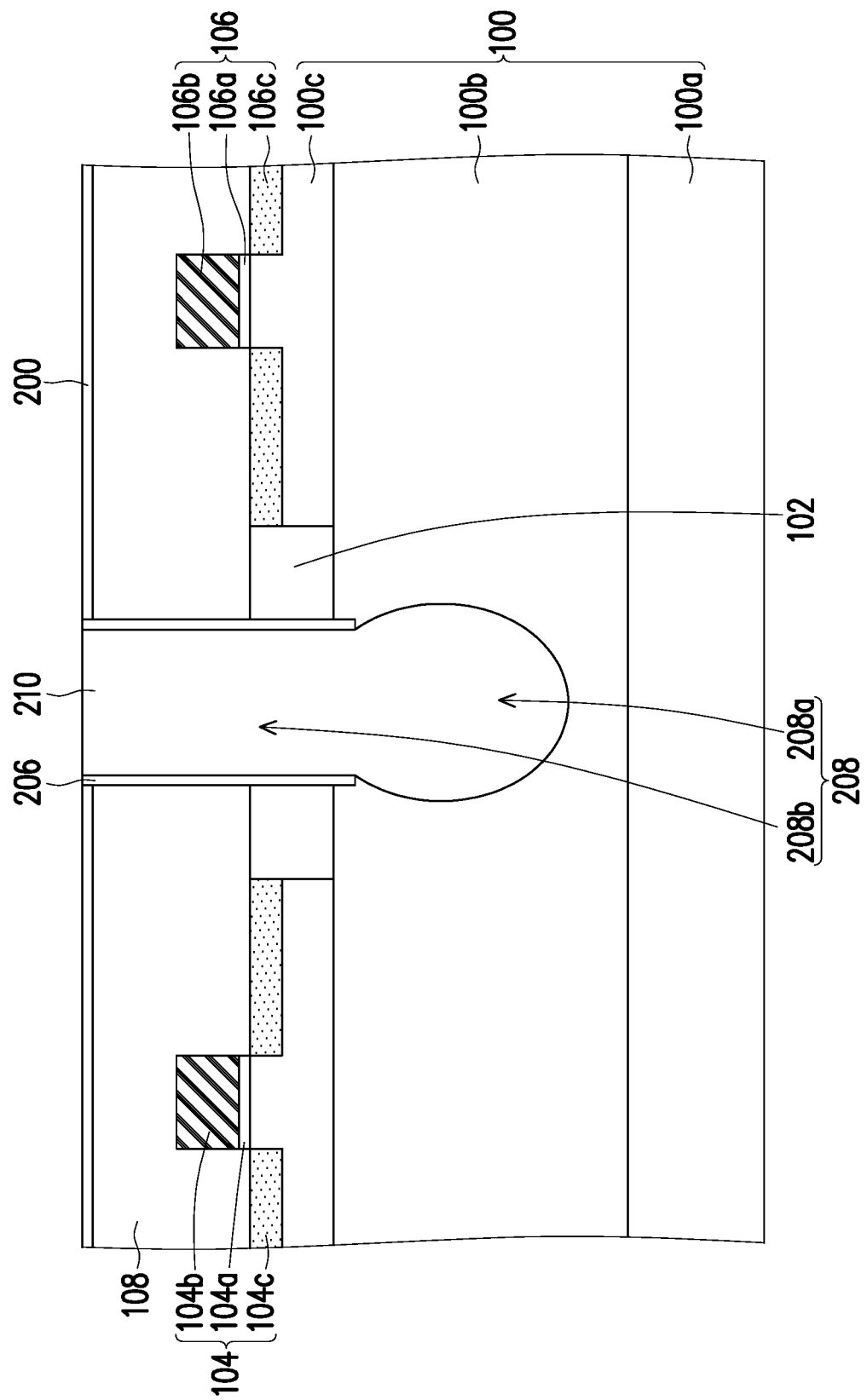

Referring to FIG. 2B, the patterned mask layer 202 is removed. Then, a liner layer 206 is formed on the sidewall of the trench 204. The liner layer 206 is, for example, a silicon nitride layer. For example, the method of forming the liner layer 206 includes forming a liner material layer conformally on the silicon-on-insulator substrate 100, and then performing an anisotropic etching process to remove the liner material layer on the bottom surface of the trench 204 and on the top surface of the etch stop layer 200. Then, an isotropic etching process is performed to remove a portion of the dielectric layer 100b and therefore form a trench 208.

Specifically, since the liner layer 206 is formed on the sidewall of the trench 204 and the etch stop layer 200 is formed on the top surface of the dielectric layer 108, only the exposed dielectric layer 100b is removed during the above isotropic etching process. In addition, based on the characteristics of the isotropic etching process, a space having a curved sidewall and an expanded width as compared to the trench 204 is formed upon the removal of the exposed dielectric layer 108. That is, the formed trench 208 has a lower portion 208a located in the dielectric layer 100b and having an expanded width as compared to the trench 204, and a remaining upper portion 208b over the lower portion 208a. Thereafter, a sacrificial layer 210 is formed in the trench 208. The sacrificial layer 210 is, for example, a common organic planarization layer (OPL).

Figure 2C:
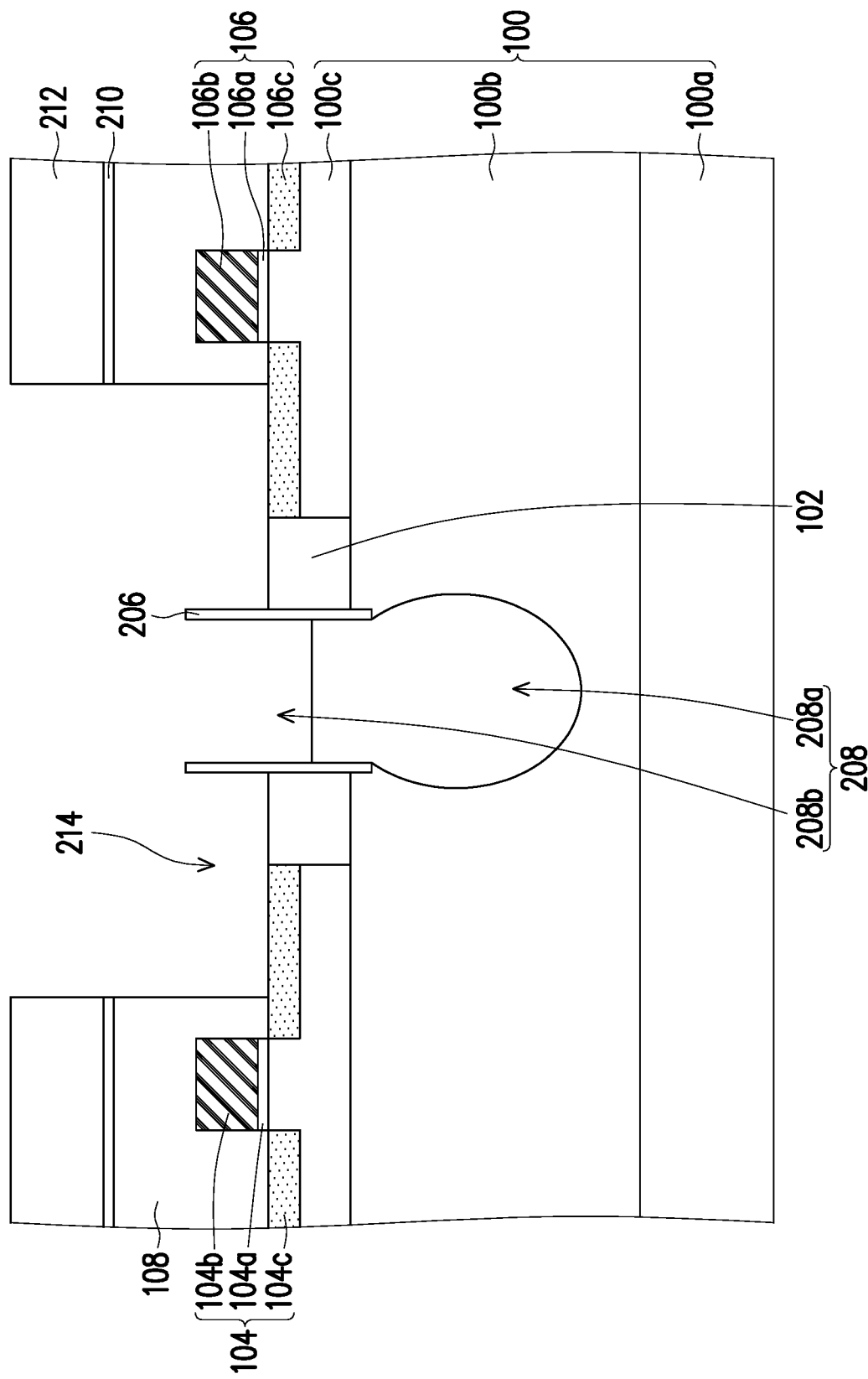

Referring to FIG. 2C, a patterned mask layer 212 is formed on the etch stop layer 200. The patterned mask layer 212 exposes the area between the gate 104b and the gate 106b. Next, an anisotropic etching process is performed by using the patterned mask layer 212 as an etch mask, so as to remove a portion of the etch stop layer 200, a portion of the dielectric layer 108 and a portion of the liner layer 206 and therefore form a trench 214. In addition, in the anisotropic etching process described above, a portion of the sacrificial layer 210 in the upper portion 208b of the trench 208 is also removed. Since another portion of the sacrificial layer 210 is still retained in the trench 208, the shape and size of the lower portion 208a of the trench 208 are not affected by the etching process.

Figure 2D:
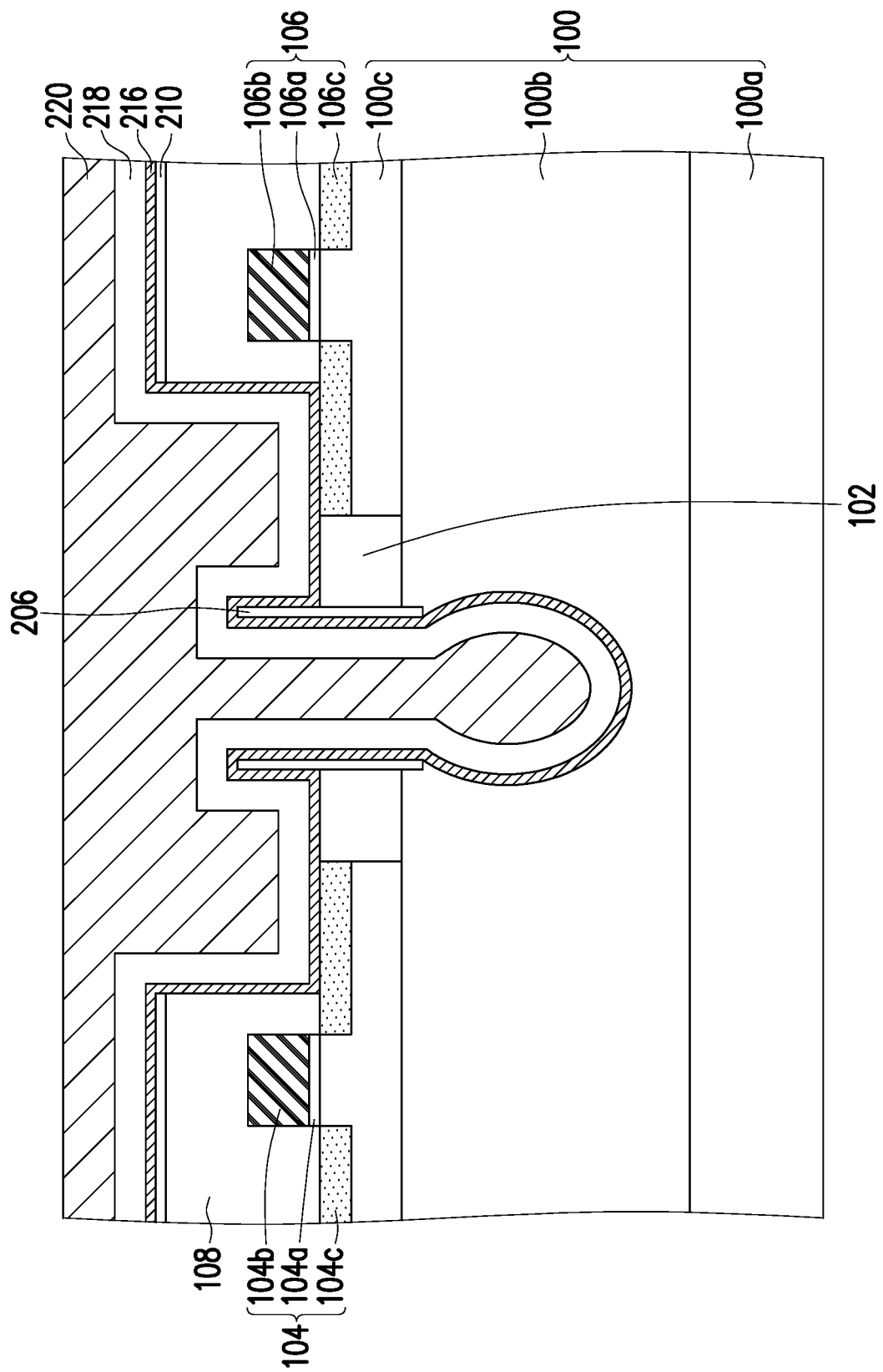

Referring to FIG. 2D, the patterned mask layer 212 is removed. Thereafter, a conductive layer 216 for forming a lower electrode of the capacitor is conformally formed on the silicon-on-insulator substrate 100. The conductive layer 216 is, for example, a titanium nitride layer. Next, a dielectric layer 218 for forming an insulating layer of the capacitor is conformally formed on the conductive layer 216. The dielectric layer 218 is, for example, a high dielectric constant (high-k) layer. Thereafter, a conductive layer 220 for forming an upper electrode of the capacitor is formed on the dielectric layer 218. The conductive layer 220 completely fills the trench 208 and the trench 214. The conductive layer 220 is, for example, a composite layer composed of a tungsten layer and a titanium nitride layer.

Figure 2E:
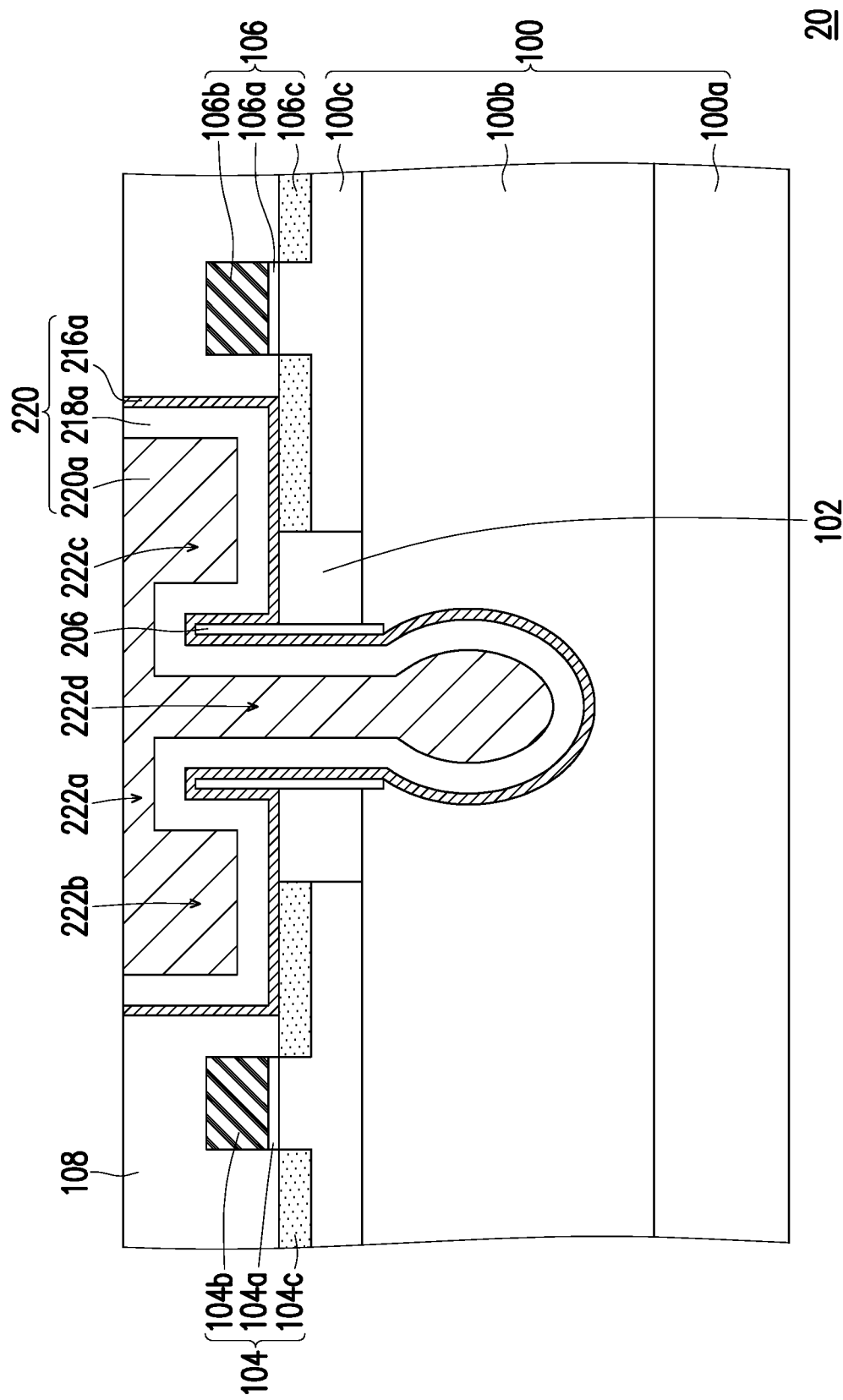

Referring to FIG. 2E, a planarization process is performed to remove a portion of the sacrificial layer 210, a portion of the conductive layer 216, a portion of the dielectric layer 218 and a portion of the conductive layer 220 until the dielectric layer 108 is exposed. The above planarization process is, for example, a chemical mechanical polishing process. After the planarization process, a capacitor 222 is formed to include a lower electrode 216a, an insulating layer 218a and an upper electrode 220a. That is, the capacitor 222 belongs to the well-known metal-insulator-metal capacitor. Accordingly, the memory structure 20 of the present embodiment is completed. In addition, a contact connected to the transistor 104, a contact connected to the transistor 106, a contact connected to the upper electrode 124a of the capacitor 222, and the like may be subsequently formed, and these elements are well-known to those skilled in the art and are not be described herein.

In the present embodiment, the memory structure 20 includes a silicon-on-insulator substrate 100, an isolation structure 102, a transistor 104, a transistor 106, a capacitor 222 and a liner layer 206. The capacitor 222 is disposed between the transistor 104 and the transistor 106. The capacitor 222 is composed of a lower electrode 216a, an insulating layer 218a and an upper electrode 220a, and the insulating layer 218a is located between the lower electrode 216a and the upper electrode 220a. Further, the capacitor 222 includes a body portion 222a, an extension portion 222b, an extension portion 222c and an extension portion 222d. Each of the body portion 222a, the extension portion 222b, the extension portion 222c, and the extension portion 222d includes a part of the lower electrode 216a, a part of the insulating layer 218a and a part of the upper electrode 220a. As shown in FIG. 2E, the body portion 222a is substantially horizontally located between the gate 104b and the gate 106b. The extension portion 222b extends from the body portion 222a to the source/drain region (e.g., doped region 104c) of the transistor 104, and is electrically connected to the source/drain region of the transistor 104 via the lower electrode 216a. The extension portion 222c extends from the body portion 222a to the source/drain region (e.g., doped region 106c) of the transistor 106 and is electrically connected to the source/drain region of the transistor 106 via the lower electrode 216a. The extension portion 222d extends from the body portion 222a, penetrates through the isolation structure 102, and further extends into the dielectric layer 100b. Accordingly, the capacitor 222 can be electrically connected to both the transistor 104 and the transistor 106. In addition, in the extension portion 222d, the projection area of the part located in the lower portion 208a of the trench 208 on the silicon base 100a is greater than the projection area of the part located in the upper portion 208b of the trench 208 on the silicon base 100a. The liner layer 206 is disposed between the extension portion 222b and the extension portion 222d, between the extension portion 222c and the extension portion 222d, between the isolation structure 102 and the extension portion 222d, and between the dielectric layer 100b and the extension portion 222d.

In the memory structure 20, the extension portion 222d of the capacitor 222 penetrates down through the isolation structure 102, and extends into the dielectric layer 100b, so that the coupling ratio between the lower electrode 216a and the upper electrodes 220a and therefore the performance of the memory structure can be improved without increasing the layout area and the thickness of the memory structure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A memory structure, comprising:
a silicon-on-insulator substrate, comprising a silicon base, and a first dielectric layer and a silicon layer sequentially disposed on the silicon base;
a first transistor and a second transistor, disposed on the silicon layer;
an isolation structure, disposed in the silicon layer between the first transistor and the second transistor;
a capacitor, disposed between the first transistor and the second transistor, and comprising:
a body portion;
a first extension portion, extending from the body portion to a source/drain region of the first transistor and connected to the source/drain region of the first transistor;
a second extension portion, extending from the body portion to a source/drain region of the second transistor and connected to the source/drain region of the second transistor;
a third extension portion, extending from the body portion, penetrating through the isolation structure, and extending into the first dielectric layer,
wherein each of the body portion, the first extension portion, the second extension portion and the third extension portion is composed of a lower electrode, an upper electrode and an insulating layer between the lower electrode and the upper electrode.

2. The memory structure of claim 1, wherein the first transistor is one of an N-type metal oxide semiconductor transistor and a P-type metal oxide semiconductor transistor, and the second transistor is the other of the N-type metal oxide semiconductor transistor and the P-type metal oxide semiconductor transistor.

3. The memory structure of claim 1, further comprising a second dielectric layer disposed on the silicon layer and covering the first transistor and the second transistor, wherein the body portion, the first extension portion, the second extension portion and a portion of the third extension portion are located in the second dielectric layer.

4. The memory structure of claim 1, wherein a width of the third extension portion is substantially constant.

5. The memory structure of claim 1, wherein a thickness of the isolation structure is the same as a thickness of the silicon layer.

6. The memory structure of claim 1, wherein the lower electrode in the first extension portion is connected to the source/drain region of the first transistor.

7. The memory structure of claim 1, wherein the lower electrode in the second extension portion is connected to the source/drain region of the second transistor.

8. A memory structure, comprising:
a silicon-on-insulator substrate, comprising a silicon base, and a first dielectric layer and a silicon layer sequentially disposed on the silicon base;
a first transistor and a second transistor, disposed on the silicon layer;
an isolation structure, disposed in the silicon layer between the first transistor and the second transistor;
a capacitor, disposed between the first transistor and the second transistor, and comprising:
a body portion;
a first extension portion, extending from the body portion to a source/drain region of the first transistor and connected to the source/drain region of the first transistor;
a second extension portion, extending from the body portion to a source/drain region of the second transistor and connected to the source/drain region of the second transistor;
a third extension portion, extending from the body portion, penetrating through the isolation structure, and extending into the first dielectric layer, and comprising a first part and a second part, wherein the second part is located in the first dielectric layer, and a projection area of the second part on the silicon base is greater than a projection area of the first part on the silicon base; and a liner layer, disposed between the first extension portion and the third extension portion, between the second extension portion and the third extension portion, between the isolation structure and the third extension portion, and between the first dielectric layer and the third extension portion, wherein each of the body portion, the first extension portion, the second extension portion and the third extension portion is composed of a lower electrode, an upper electrode and an insulating layer between the lower electrode and the upper electrode.

9. The memory structure of claim 8, wherein the first transistor is one of an N-type metal oxide semiconductor transistor and a P-type metal oxide semiconductor transistor, and the second transistor is the other of the N-type metal oxide semiconductor transistor and the P-type metal oxide semiconductor transistor.

10. The memory structure of claim 8, further comprising a second dielectric layer disposed on the silicon layer and covering the first transistor and the second transistor, wherein the body portion, the first extension portion, the second extension portion and a portion of the third extension portion are located in the second dielectric layer.

11. The memory structure of claim 8, wherein the first part is partially located in the first dielectric layer.

12. The memory structure of claim 8, wherein a thickness of the isolation structure is the same as a thickness of the silicon layer.

13. The memory structure of claim 8, wherein the lower electrode in the first extension portion is connected to the source/drain region of the first transistor.

14. The memory structure of claim 8, wherein the lower electrode in the second extension portion is connected to the source/drain region of the second transistor.

* * * * *